US006990207B2

(12) United States Patent
Nakamura et al.

(10) Patent No.: US 6,990,207 B2
(45) Date of Patent: Jan. 24, 2006

(54) ACTIVE NOISE CONTROL SYSTEM

(75) Inventors: Yoshio Nakamura, Neyagawa (JP); Toshihiko Ohashi, Hirakata (JP); Kenichi Terai, Shijonawate (JP); Hiroyuki Hashimoto, Ibaraki (JP); Isao Kakuhari, Ikoma (JP); Hisashi Sano, Wako (JP); Toshio Inoue, Wako (JP); Akira Takahashi, Wako (JP); Tsuyoshi Yamashita, Wako (JP)

(73) Assignees: Matsushita Electric Industrial Co., Ltd., Osaka (JP); Honda Giken Kogyo Kabushiki Kaisha, Tokyo (JP)

( * ) Notice: Subject to any disclaimer, the term of this patent is extended or adjusted under 35 U.S.C. 154(b) by 716 days.

(21) Appl. No.: 09/864,775

(22) Filed: May 24, 2001

(65) Prior Publication Data

US 2001/0046301 A1 Nov. 29, 2001

(30) Foreign Application Priority Data

May 24, 2000 (JP) ............................ 2000-152314

(51) Int. Cl.
*H03B 29/00* (2006.01)

(52) U.S. Cl. .................... 381/71.13; 381/71.4; 381/55

(58) Field of Classification Search .............. 381/71.1, 381/71.13, 71.6, 55, 71.4
See application file for complete search history.

(56) References Cited

U.S. PATENT DOCUMENTS

| | | | | | |
|---|---|---|---|---|---|
| 4,455,675 | A | * | 6/1984 | Bose et al. | 381/71.6 |
| 4,953,217 | A | * | 8/1990 | Twiney et al. | 381/71.6 |
| 5,469,510 | A | * | 11/1995 | Blind et al. | 381/71.4 |
| 5,577,126 | A | * | 11/1996 | Klippel | 381/55 |

* cited by examiner

*Primary Examiner*—Brian T. Pendleton
(74) *Attorney, Agent, or Firm*—Jordan and Hamburg LLP

(57) ABSTRACT

An active noise control system for reducing road noise of low frequency generated inside the cabin of a vehicle is provided. The active noise control system includes a noise detector, a signal generator for processing the input noise signal to generate a signal for producing noise canceling waves, a limiting amplifier having a specified threshold value for variably amplifying the processed signal so that the amplitude of output signal will not exceed the threshold value, and an electrical acoustic converter for producing noise canceling acoustic waves in accordance with the output signal.

2 Claims, 4 Drawing Sheets

ACTIVE NOISE CONTROL SYSTEM

BACKGROUND OF THE INVENTION

1. Technical Field of the Invention

The present invention relates to an active noise control system for reducing undesirable noise by producing noise canceling waves which are shifted 180 degrees in phase with respect to the noise. More particularly, the invention relates to an active noise control system suitable for reducing undesirable road noise of a frequency of 100 Hz or lower, which is generated inside the cabin of a vehicle caused by shocks or vibrations during the drive of the vehicle.

2. Description of Related Art

Known active noise control system for reducing road noise of a vehicle involves deriving a signal indicative of noise by a noise detector such as a microphone, and converting and amplifying the input signal for producing noise canceling waves from an electrical acoustic converter such as a speaker.

FIG. 8 shows one example of a frequency characteristic of road noise produced during the drive of a vehicle on a normal road. It has been ascertained that the peak in the vicinity of 40 Hz causes most unpleasant, depressing noise. FIG. 8 shows that high-level noises are also produced under the frequency of 30 Hz, but such does not present an audial problem as mentioned above because of the low frequency. However, these low-frequency components input to an electrical acoustic converter, which is generally a dynamic speaker, increase the amplitude of output signal, causing a distortional noise to be produced from the speaker.

To solve such problem, the speaker must have high performance to be able to produce large canceling waves corresponding to noise of low frequency having a large amplitude. This is, however, not practical in noise control applications in a vehicle, due to high cost and the physical size restrictions on the speaker.

SUMMARY OF THE INVENTION

The present invention has been devised to solve the problems pointed out above in the prior art, and therefore it is an object of the invention to provide an active noise control system for effectively reducing noise of a low frequency without producing an abnormal or distortional noise from a speaker.

To achieve the object, an active noise control system for reducing an undesirable noise according to one embodiment of the invention includes:

- a noise detector for deriving an input signal representative of the undesirable noise;
- an interfering wave signal generator for processing the input signal to produce an interfering wave signal for generating a noise canceling wave;
- a limiting amplifier having a specified output signal amplitude threshold, for outputting amplified interfering wave signal having an amplitude equal to or less than the specified output signal amplitude threshold; and
- an electrical acoustic converter for propagating the noise canceling wave.

The limiting amplifier may be divided into a limiter and an amplifier. The system may also be constructed of digital circuits.

These and other objects and characteristics of the present invention will become further clear from the following description with reference to the accompanying drawings.

DESCRIPTION OF THE PREFERRED EMBODIMENTS

Figure 1:
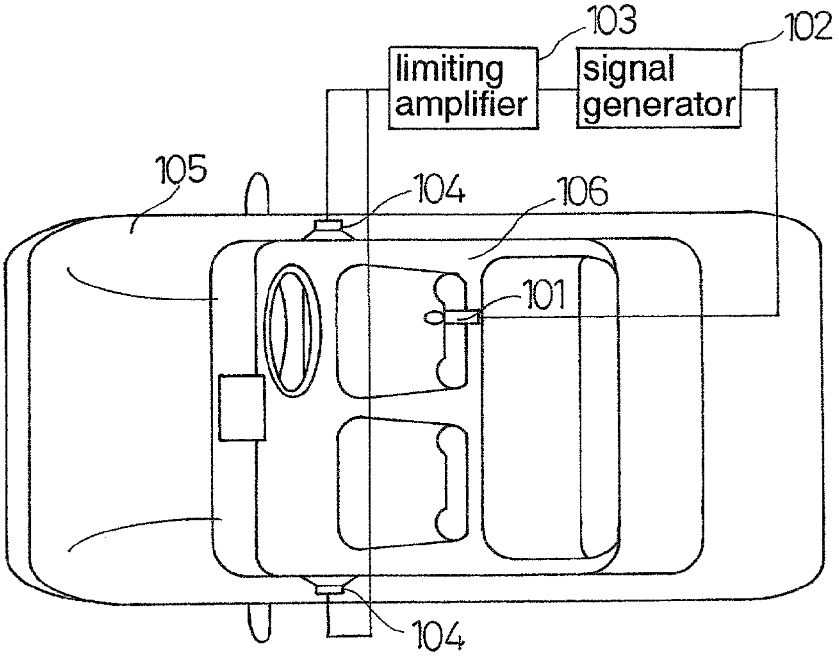
FIG. 1 is a schematic diagram showing the arrangement of an active noise control system according to one embodiment of the present invention.

FIG. 1 shows an active noise control system applied to a vehicle according to one embodiment of the present invention. A noise detector or a microphone 101 for detecting and converting noises into electric signals is disposed in the vicinity of the driver's seat. The signal indicative of noise is input to an interfering wave signal generator 102, which adjusts the amplitude and phase of the noise signal for producing noise canceling waves. A limiting amplifier 103 amplifies the input signal from the signal generator 102 variably in accordance with the size of the input signal for driving an electrical acoustic converter, which is commonly a dynamic speaker 104. The limiting amplifier 103 has a specified threshold or maximum output value associated with its output signals, and amplifies the input noise canceling wave signal so as to have an amplitude lower than the predetermined threshold level when outputted. The speaker 104 produces noise canceling acoustic waves inside the cabin 106 of the vehicle 105 in accordance with the signal output from the limiting amplifier 103.

Thus a loop is formed from the noise detector 101 to the speaker 104 via the cabin 106. The noise Vn' at the position of the noise detector 101 can be expressed as $Vn'=Vn/(1-F(s))$, where F(s) is an open-loop transfer function and Vn is the noise detected in a state without the active noise control system.

Figure 3:
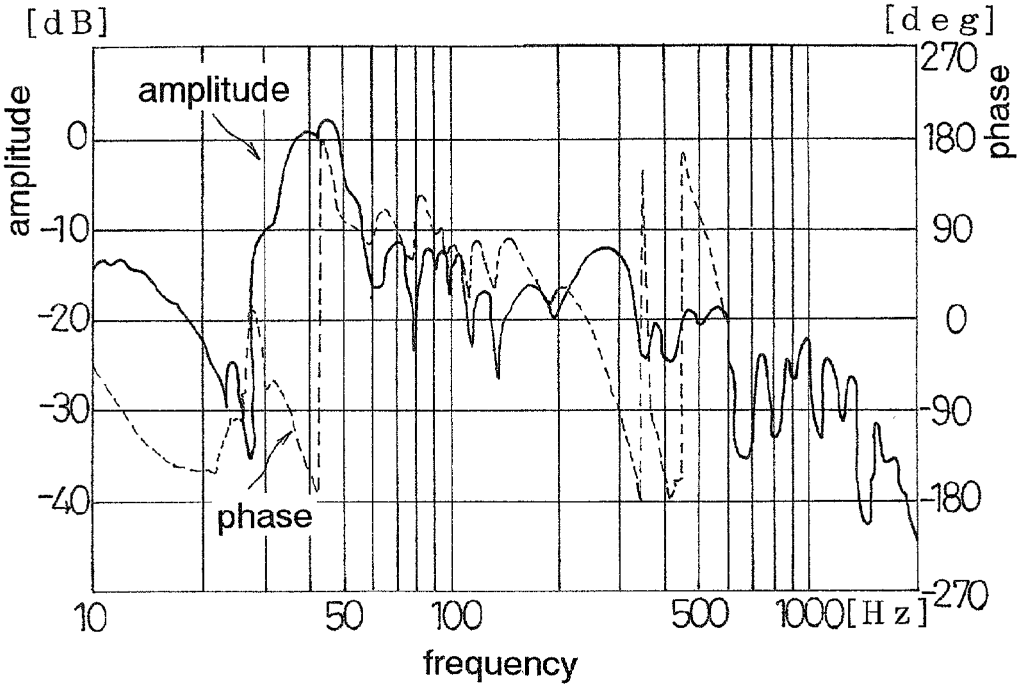
FIG. 3 is a chart representing characteristics of an open-loop transfer function used in the active noise control of the invention.

The signal generator 102 adjusts the open-loop transfer function F(s) within the range of frequency including the low frequency of the noise to be reduced. FIG. 3 is a graph representing the characteristics of one example of the open-loop transfer function F(s) used in the noise control of the present invention with respect to the amplitude and the phase. As shown in FIG. 3, the signal generator 102 processes the input noise signal to produce an interfering wave signal which has an amplitude and a phase optimal for canceling the noise signal wave at the frequency of 40 Hz. Thus the noise around 40 Hz is effectively reduced.

Figure 4:
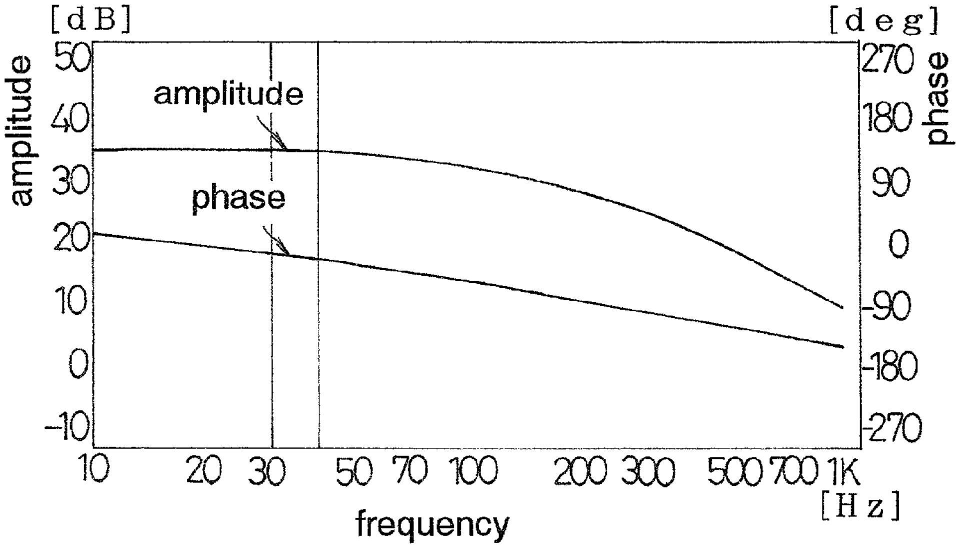
FIG. 4 is a chart representing transfer function of a signal generator according to the invention.

The transfer function of the signal generator 102 is shown in FIG. 4. As can be seen from FIG. 4, the signal generator 102 passes the signal component of frequencies lower than 30 Hz. Therefore, input large noise signals of low frequencies, which may be generated upon driving of the vehicle on a bumpy surface, will cause a distortional noise from the speaker 104. Accordingly, the limiting amplifier 103 has a specified amplitude threshold for the output value and variably amplifies the input signal for producing the interfering waves in accordance with its size. Thereby, even if there is generated a large noise of a low frequency of less than 30 Hz, the noise of the predetermined frequency, which is 40 Hz in this embodiment, is actively reduced without causing the distortional sound to be produced from the speaker 104.

Figure 5:
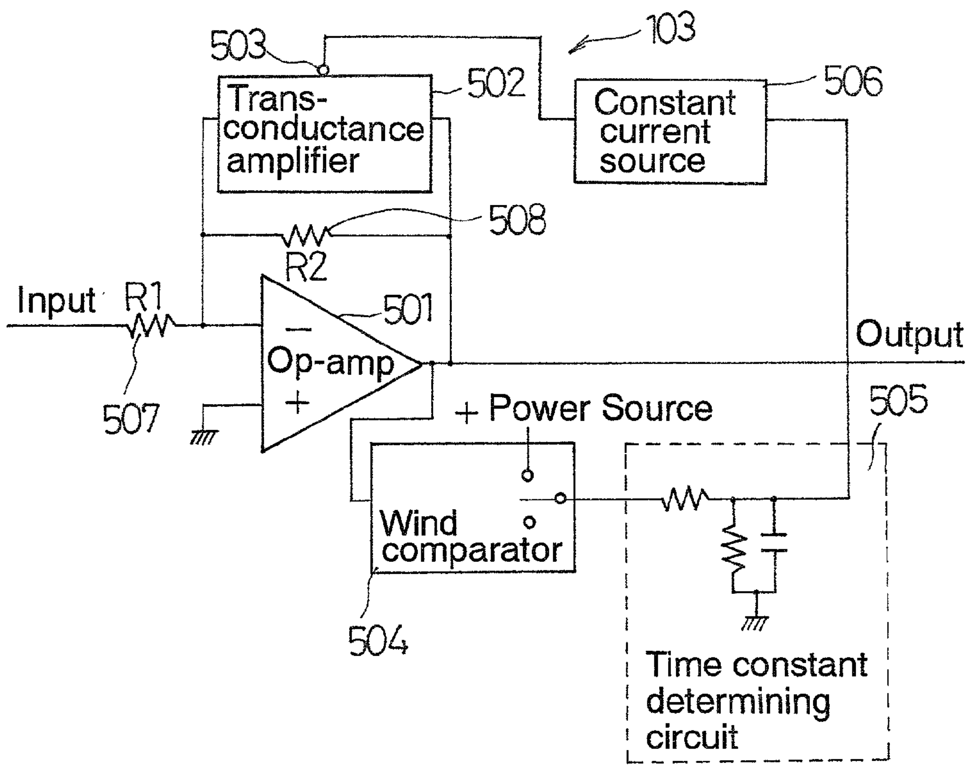
FIG. 5 is a block diagram showing one example of the arrangement of a limiting amplifier according to the invention.

FIG. 5 is a block diagram showing one example of a practical arrangement of the limiting amplifier 103. A transconductance amplifier 502 has its input connected to the output of an op-amp 501, its output being connected to the inverting input of the op-amp 501. The trans-conductance amplifier 502 can vary the conductance in accordance with electric current at an external current terminal 503. When a large current flows, it increases the conductance, whereas when a small current flows, it decreases the conductance.

To the output of the op-amp 501 is also connected a wind comparator 504. The wind comparator 504 connects the output of the op-amp 501 to the positive side of a power source when the absolute value of the output of the op-amp 501 is within a range above a predetermined threshold. If the absolute value of the output of the op-amp 501 is below the predetermined threshold, the wind comparator 504 opens the circuit.

To the output of the wind comparator 504 is connected a time constant determining circuit 505 composed of a capacitor and a resistor. The time constant determining circuit 505 is connected to a constant current source 506 for generating an electric current proportional to the output voltage of the time constant determining circuit 505. The current generated by the constant current source 506 is supplied to the external current terminal 503 of the trans-conductance amplifier 502.

A resistor 507 is provided across the input terminal of the limiting amplifier 103 and the inverting input of the op-amp 501. Across the output of the op-amp 501 and its inverting input is also provided a resistor 508.

The limiting amplifier 103 operates as follows. When the output voltage of the time constant determining circuit 505 is zero, the constant current source 506 generates no electric current. The conductance of the trans-conductance amplifier 502 at this time is also zero, and therefore the limiting amplifier 103 has a constant gain which is determined by R2/R1.

If the output of the op-amp 501 exceeds the threshold of the wind comparator 504, it connects the time constant determining circuit 505 to the positive side of the power source, whereby the time constant determining circuit 505 generates an output voltage. This accordingly increases the conductance of the trans-conductance amplifier 502 through the current provided from the constant current source 506, causing the resistor to be equivalently connected across the output and the inverting input of the op-amp 501. As a result, the gain of the limiting amplifier 103 decreases from the above-mentioned R2/R1. In the event of continuous large inputs, the gain is automatically adjusted so that the amplitude of the output signal from the op-amp 501 slightly exceeds the threshold value of the wind comparator 504.

Thus, should large signals be input, the limiting amplifier 103 reduces its gain, so that it will not output a signal having a correspondingly large amplitude, whereby abnormal noise from the speaker is prevented. Also, while restricting the amplitude of the output signal, the limiting amplifier 103 automatically adjusts its gain to be maximum, whereby the noise control effect is maximally achieved while preventing abnormal noises from the speaker. It should be noted that the circuit arrangement for the limiting amplifier 103 is not limited to the example shown in FIG. 5 and various other arrangements may be employed for achieving the same effect.

Figure 2:
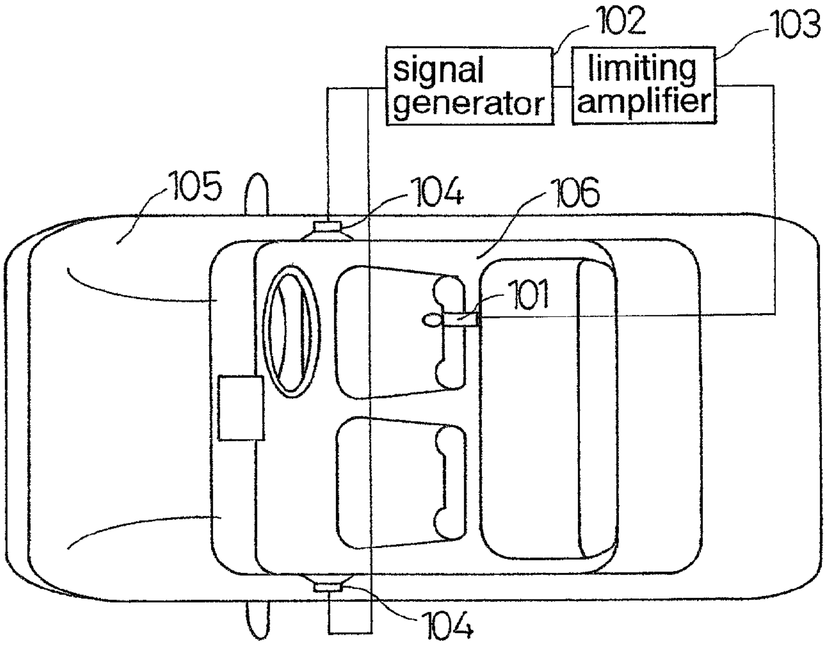
FIG. 2 is a schematic diagram showing the arrangement of an active noise control system according to another embodiment of the invention.

FIG. 2 is a diagram showing the arrangement of an active noise control system applied to a vehicle according to another embodiment of the present invention. The system according to this embodiment has substantially the same constituent elements as those of the previously described embodiment, and the description of the common elements will be omitted. As can be seen from the drawing, the positions of the signal processor 102 and the limiting amplifier 103 are inverted in this embodiment. The system operates similarly as described in the foregoing.

Figure 6:
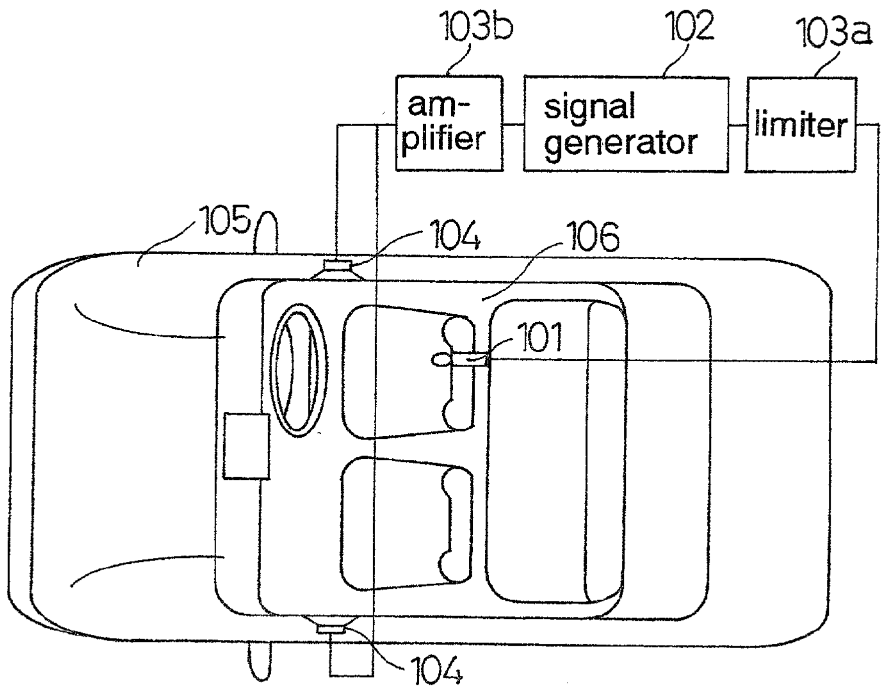
FIG. 6 is a schematic diagram showing the arrangement of an active noise control system according to yet another embodiment of the invention.

FIG. 6 is a diagram showing the arrangement of an active noise control system applied to a vehicle according to yet another embodiment of the present invention. Instead of providing the limiting amplifier 103 as in the previously described embodiments, a limiter 103*a* is provided on the upstream side of the signal generator 102 and an amplifier 103*b* is provided on the downstream side of the signal generator 102. The system according to this embodiment has substantially the same constituent elements as those of the previously described embodiment apart from the limiting amplifier 103, and operates as described in the foregoing. The description of the common elements will be omitted.

The system shown in FIG. 6 may be modified such that the positions of the limiter 103*a* and the amplifier 103*b* are inverted, the limiter 103*a* being provided on the downstream side of the signal generator 102 while the amplifier 103*b* being provided on the upstream side of the signal generator 102.

Figure 7:
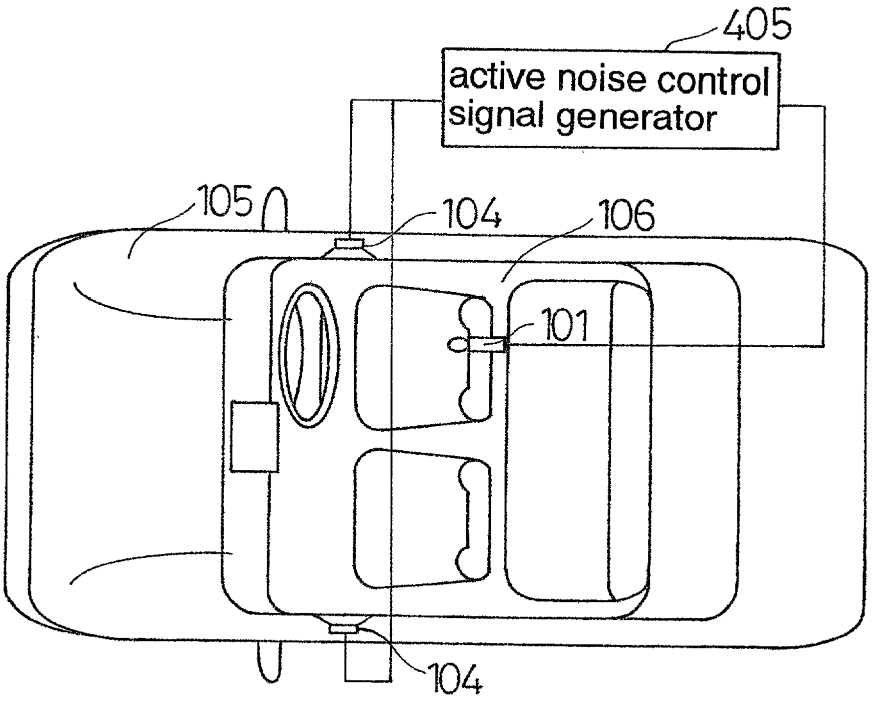
FIG. 7 is a schematic diagram showing the arrangement of an active noise control system according to a further embodiment of the invention.
Figure 8:
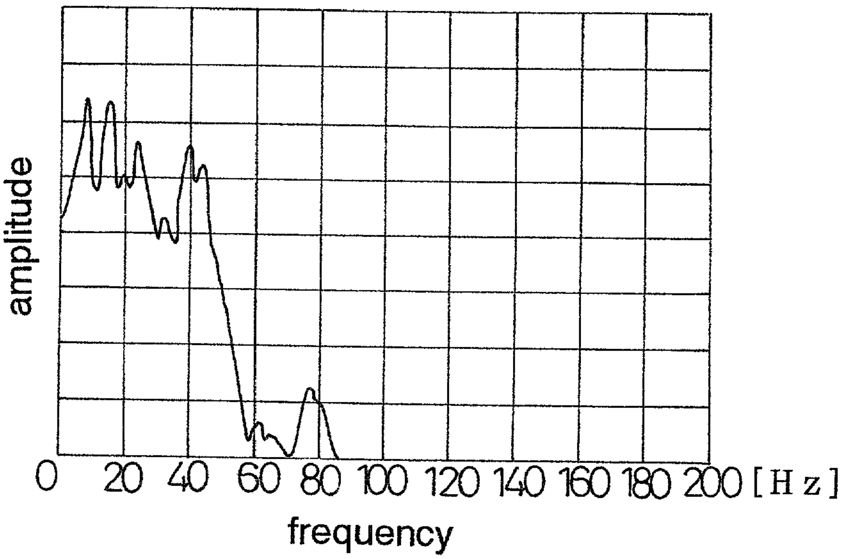
FIG. 8 is a chart showing a frequency characteristic of road noise detected during the drive of a vehicle.

FIG. 7 is a diagram showing the arrangement of an active noise control system applied to a vehicle according to a further embodiment of the present invention. The system has an active noise control signal generator 405 constructed of digital circuits having the combined functions of the above-described limiting amplifier 103 and the signal generator 102. Other constituent elements are identical with those of the previously described embodiment, and the description thereof will be omitted.

The digital filter of the active noise control signal generator 405 generates signals for producing noise canceling waves based on the A/D converted signals representative of noise detected by the microphone 101. The limiting amplifier calculates an optimal constant gain for outputting D/A converted, amplified signals when the output value from the digital filter is below a specified threshold value. If the output value from the digital filter exceeds the threshold, the limiting amplifier varies the gain to be optimal in accordance with output value from the digital filter, converts the digital signal into an analog signal, and amplifies and outputs same to the speaker 104.

According to the invention, as described above, by providing the limiting amplifier, a large noise signal at low frequencies is processed so as not to cause distortion in the speaker for producing noise canceling waves. In doing so, the limiting amplifier adjusts the gain to be maximum in accordance with the level of the noise signal, whereby an optimal noise reducing effect is achieved.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. An active noise control system for use on a vehicle for reducing undesirable noise emanating from the vehicle due to operation of the vehicle, said system comprising:

a noise detector for deriving an input signal representative of the undesirable noise;

an interfering wave signal generator for processing the input signal to produce an interfering wave signal for generating a noise canceling wave;

a limiting amplifier having a specified output signal amplitude threshold, for outputting amplified interfering wave signal having an amplitude equal to or less than the specified output signal amplitude threshold; and an electrical acoustic converter for propagating the noise canceling wave;

wherein when an output of the limiting amplifier has a frequency of less than or equal to 30 Hz, and an amplitude less than or equal to the specified output signal amplitude threshold, the limiting amplifier has a constant gain; and when the output of the limiting amplifier has a frequency less than or equal to 30 Hz and an amplitude greater than the specified output signal amplitude threshold, the limiting amplifier has a gain which is adjusted in accordance with a size of an input signal.

2. An active noise control system for use on a vehicle to reduce undesirable noise emanating from the vehicle due to operation of the vehicle, said system comprising:

a noise detector for deriving an input signal representative of the undesirable noise;

an interfering wave signal generator for producing an interfering wave signal for generating a noise canceling wave;

a limiting amplifier having a specified output signal amplitude threshold, for outputting an amplified interfering wave signal having an amplitude less than or equal to the specified output signal amplitude threshold; and an electrical acoustic converter for propagating the noise canceling wave;

wherein when an output of the limiting amplifier has a frequency of less than or equal to 30 Hz, and an amplitude less than or equal to the specified output signal amplitude threshold, the limiting amplifier has a constant gain; and when the output of the limiting amplifier has a frequency less than or equal to 30 Hz and an amplitude greater than the specified output signal amplitude threshold, the limiting amplifier has a gain which is adjusted in accordance with a size of an input signal.

* * * * *